(12) United States Patent
Tada et al.

(10) Patent No.: US 6,177,149 B1
(45) Date of Patent: Jan. 23, 2001

(54) METHOD OF FORMING TITANIUM FILM BY CVD

(75) Inventors: Kunihiro Tada, Nirasaki; Hayashi Otsuki, Naka-koma-gun, both of (JP)

(73) Assignee: Tokyo Electron Limited, Tokyo-to (JP)

( * ) Notice: Under 35 U.S.C. 154(b), the term of this patent shall be extended for 0 days.

(21) Appl. No.: 09/216,938

(22) Filed: Dec. 21, 1998

(30) Foreign Application Priority Data

Dec. 24, 1997 (JP) .................................................... 9-366066

(51) Int. Cl.[7] .............................. H05H 1/24; C23C 16/14
(52) U.S. Cl. .................. 427/576; 427/253; 427/255.394; 427/573; 438/627; 438/648; 438/656; 438/680; 438/685
(58) Field of Search ..................................... 427/576, 575, 427/569, 253, 255.394, 573; 438/648, 656, 674, 680, 653, 685, 627

(56) References Cited

U.S. PATENT DOCUMENTS

| 5,344,792 | 9/1994 | Sandhu et al. | |
|---|---|---|---|
| 5,716,870 | * 2/1998 | Foster et al. | 427/576 |
| 5,747,384 | * 5/1998 | Miyamoto | 438/685 |
| 5,876,796 | * 3/1999 | Regolini et al. | 427/255.29 |
| 5,926,737 | * 7/1999 | Ameen et al. | 438/682 |
| 5,942,282 | * 8/1999 | Tada et al. | 438/680 |

FOREIGN PATENT DOCUMENTS 8283944   10/1996   (JP) .

* cited by examiner

*Primary Examiner*—Shrive Beck
*Assistant Examiner*—Bret Chen
(74) *Attorney, Agent, or Firm*—Smith, Gambrell & Russell, LLP (57) ABSTRACT

A Ti film is formed by CVD in holes formed in an insulating film formed on a Si substrate or on a Si film formed on a Si substrate by a method comprising the steps of: loading a Si substrate into a film forming chamber; evacuating the chamber at a predetermined vacuum; supplying $TiCl_4$ gas, $H_2$ gas, Ar gas and $SiH_4$ gas into the film forming chamber; and producing a plasma in the film forming chamber to deposit a Ti film in the holes formed in the insulating film. The Si substrate is heated at 550° C. or above during the deposition of the Ti film, and the flow rates of the processing gases are regulated so that Si-to-insulator selectivity is not less than one. This method enables formation of a Ti film on a Si base at positions of holes in an insulating layer, with a good morphology of the interface between the Si base and the Ti film and with a good step coverage.

15 Claims, 6 Drawing Sheets

SiH4 1sccm

F I G. 7

SiH4 1sccm

F I G. 6

METHOD OF FORMING TITANIUM FILM BY CVD

BACKGROUND OF THE INVENTION

1. Field of the Invention

The present invention relates to a method of forming a titanium (Ti) film to be used as a contact metal film or an adhesion layer for a semiconductor device by a chemical vapor deposition (CVD) process.

2. Description of the Related Art

Recently, most semiconductor integrated circuits are fabricated in a circuit configuration of a multilevel structure to cope with market demand for high-density and large-scale integration. Accordingly, techniques for filling contact holes for the electrical connection of semiconductor devices formed in a lower layer to wiring lines formed in upper wiring layers, and via holes for the electrical connection of wiring lines in different wiring layers have become important.

Generally, aluminum (Al), tungsten (W), aluminum-base alloys and tungsten-base alloys are used for filing contact holes and via holes. If a contact hole (or a via hole) is filled with such a metal or an alloy, which is in direct contact with an Al wiring line or a silicon (Si) substrate in a lower layer, it is possible that an alloy of silicon and aluminum is produced in the boundary owing to the diffusion of Al and Si. Such an alloy has a high resistivity and is undesirable in view of need to reduce the power consumption and to increase the operating speed of integrated circuits If W or a W-base alloy is used for filling a contact hole, $WF_6$ gas as a source gas for depositing W or the W-base alloy tends to deteriorate the electrical properties of the Si substrate.

To avoid such problems, a barrier layer is formed on surfaces defining contact holes or via holes before filling the contact holes and the via holes with the filing metal. Generally, a two-layer barrier layer consisting of a Ti film and a TiN (titanium nitride) film is used as the barrier layer. It has been the usual way to form such a barrier layer by a physical vapor deposition (PVD) process. However, a PVD film has a poor coverage and is incapable of meeting the requirements of tight design rule, the reduction of the width of lines and diameter of openings and the increase of aspect ratio to meet the recent demand for the enhancement of the level of integration and the miniaturization of IC chips.

Recently, Ti films and TiN films have been formed by a CVD process capable of forming such films in a better film quality than the PVD process. The Ti film serving as a contact metal film is formed by a plasma CVD process. Usually, the plasma CVD process for forming a Ti film uses $TiCl_4$ gas as a source gas, $H_2$ gas and Ar gas. During the plasma CVD process, Si forming the substrate and Ti contained in the source gas interact and Si diffuses in the Ti layer, deteriorating the morphology of a $TiSi_X$ (typically, $TiSi_2$) interfacial layer formed between the Si substrate and the Ti layer. The diffusion of Si into the Ti layer is liable to cause junction leakage when the Ti layer is used for filling a contact hole and affects adversely to electrical connection when the same is used for filling a via hole.

The aspect ratio of contact holes and via holes formed in $SiO_2$ insulating films has increased with the progressive miniaturization of IC chips. Therefore, the Ti film is required to be formed in a satisfactory step coverage.

The present invention has been made in view of the above and it is therefore an object of the present invention to provide a method of forming a Ti film by CVD, capable of forming a Ti film in minute holes formed in an insulating film in a satisfactory step coverage without deteriorating the morphology of a $TiSi_X$ interfacial layer formed between the Ti film and a Si base.

SUMMARY OF THE INVENTION

According to the present invention, there is provided a method of forming a titanium film (by CVD) in holes formed in an insulating film formed on a silicon base, comprising the steps of loading a silicon base formed with holes into a film forming chamber, evacuating the chamber at a predetermined vacuum, supplying processing gases including $TiCl_4$ gas, a reduction gas, Ar gas and $SiH_4$ gas into the film forming chamber, and producing a plasma in the film forming chamber to deposit a titanium film in the holes formed in the insulating film, in which the silicon base is heated at 550° C. or above during the deposition of the titanium film, and the flow rates of the processing gases are regulated so that a silicon-to-insulating film selectivity is not less than one.

The flow rates of the processing gases may be selected so that the silicon -to-insulating film selectivity is three or more. $SiH_4$ may have a flow rate which is from about 10 to about 50% of the flow rate of $TiCl_4$. Furthermore, $SiH_4$ may have a flow rate which is from about 0.05 to about 0.25% of the flow rate of all of the processing gases. The temperature of the silicon base during the film formation is preferably from 580 to 630° C. $H_2$ gas is used most advantageously as the reduction gas.

The inventors of the present invention made studies to form a Ti film by CVD in a satisfactory step coverage without deteriorating the morphology of the $TiSi_X$ layer and found that such a Ti film can be formed when the temperature of the substrate is 550° C. or above, SiH4 gas is used in addition to $TiCl_4$ gas, $H_2$ gas and Ar gas, and the respective flow rates of those processing gases are adjusted properly.

The deterioration of the morphology of the $TiSi_X$ interfacial layer formed between the Ti film and the Si base is caused by the interaction of Si and Ti, and the irregular diffusion of Si into the Ti film during the formation of the Ti film. $SiH_4$ gas suppresses the irregular diffusion of Si into the Ti film to prevent the deterioration of the morphology of the $TiSi_X$ layer. However, since $SiH_4$ gas is a reducing gas, $TiSi_X$ is produced by the interaction of $SiH_4$ gas and $TiCl_4$ gas and such a reaction deteriorates the step coverage.

To utilize the function of $SiH_4$ to avoid deteriorating the morphology of the $TiSi_X$ layer without deteriorating the step coverage of the CVD-Ti film, it is effective to increase the silicon-to-insulating film selectivity by heating the substrate at 550° C. or above during the film forming process, and to adjust the flow rates of the processing gases, particularly, the flow rate of $SiH_4$ gas, so that the silicon-to-insulating film selectivity is not less than one. The present invention has been made on the basis of such knowledge.

The above and other objects, features and advantages of the present invention will become more apparent from the following description taken in connection with the accompanying drawings.

DESCRIPTION OF THE PREFERRED EMBODIMENTS

Figure 1:
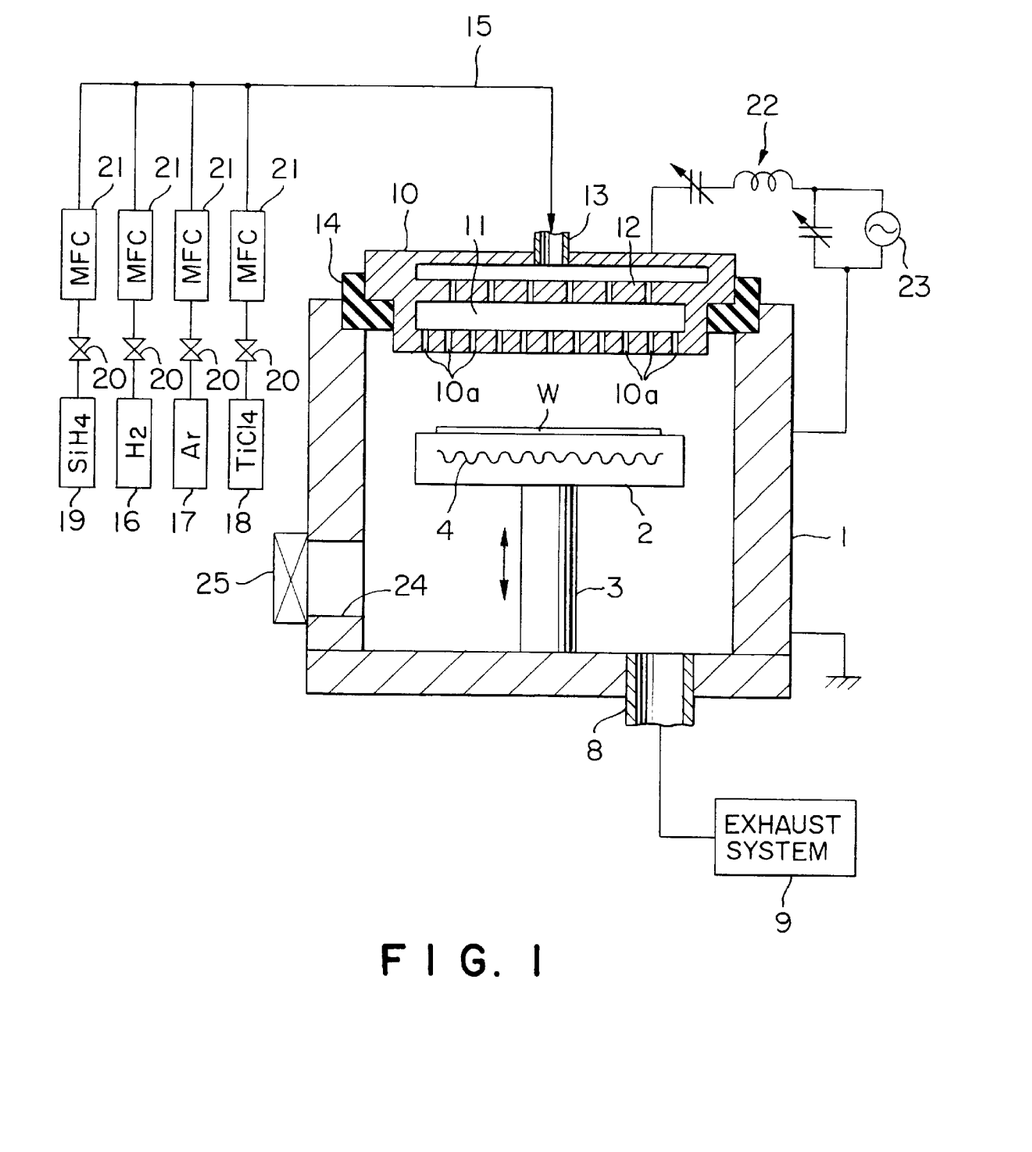
FIG. 1 is a sectional view of a film forming system for carrying out a method of forming a Ti film by CVD in a preferred embodiment of the present invention.

Referring to FIG. 1, a film forming system for carrying out a method of forming a titanium (Ti) film by CVD in a preferred embodiment of the present invention has a substantially cylindrical vessel 1 defining an airtight film forming chamber, a susceptor 2 for supporting a silicon (Si) wafer or substrate W, i.e., an object to be processed, in a horizontal attitude thereon, and a cylindrical support member 3 supporting the susceptor 2 for vertical movement. A heating element 4 is embedded in the susceptor 2. Power is supplied by a power source, not shown, to the heating element 4 to heat a silicon (Si) wafer W supported on the susceptor 2 at a predetermined temperature.

A shower head 10 is disposed on the upper wall of the vessel 1 so as to face a Si wafer W supported on the susceptor 2. The shower head 10 has a lower wall provided with a plurality of gas discharge holes 10a and facing a Si wafer W supported on the susceptor 2, a space 11, a perforated diffusing wall 12 formed in the space 11, and an upper wall provided with a gas supply port 13. A gas supply pipe 15 is connected to the gas supply port 13.

The gas supply pipe 15 is connected to hydrogen (H) gas source 16, an argon (Ar) gas source 17, a titanium tetrachloride ($TiCl_4$) gas source 18 and a silane ($SiH_4$) gas source 19 through mass flow controllers 21 and valves 20. The processing gases are supplied from the gas sources 16, 17, 18 and 19 through the gas supply pipe 15 and the shower head 10 into the film forming chamber defined by the vessel 1, whereby a titanium (Ti) film is formed on the silicon wafer.

A radio frequency power source 23 is connected through a matching circuit 22 to the shower head 10 to apply a radio frequency voltage to the shower head 10. The processing gases are ionized in the vessel 1 by radio frequency power supplied to the shower head 10 to produce a plasma of the source gas in the vessel 1. The shower head 10 is electrically isolated from the vessel 1 by an insulating member 14, and the vessel 1 is grounded.

The bottom wall of the vessel 1 is provided with an exhaust port 8. An exhaust system 9 for evacuating the vessel 1 is connected to the exhaust port 8. The vessel 1 has a side wall provided in its lower part with an opening 24. A gate valve 25 is disposed in the opening 24 to open and close the opening 24. The gate valve 25 is opened and the susceptor 2 is lowered to its lower position when carrying a wafer W into and carrying the same out of the vessel 1 through the opening 24.

When forming a Ti film by the film forming system, the gate valve 25 is opened, a Si wafer W is loaded into the vessel 1 and is mounted on the susceptor 2, the Si wafer W is heated by the heating element 4, the vessel is evacuated to a high vacuum by a vacuum pump included in the exhaust system 9, $TiCl_4$ gas, $H_2$ gas, Ar gas and $SiH_4$ gas are supplied into the vessel 1, and a radio frequency voltage is applied to the shower head 10 by the radio frequency power source 23 to produce a plasma in the shower head 10.

Figure 2A:
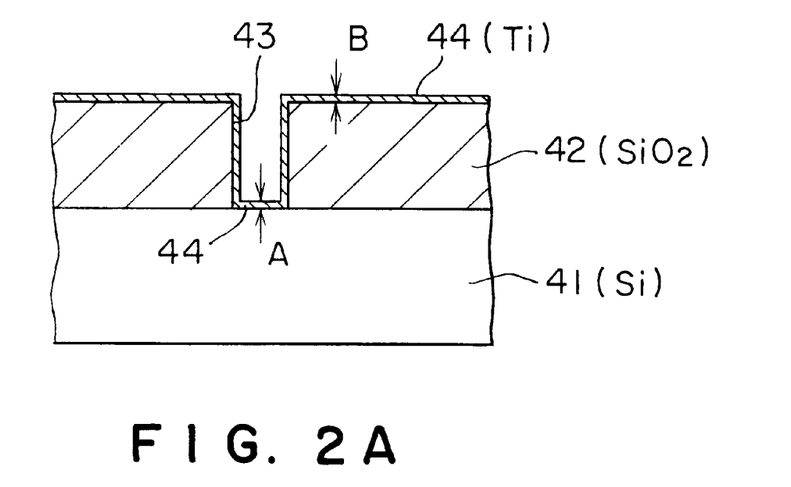
FIGS. 2A and 2B are fragmentary sectional views of Si substrates to which the present invention is applied.
Figure 2B:
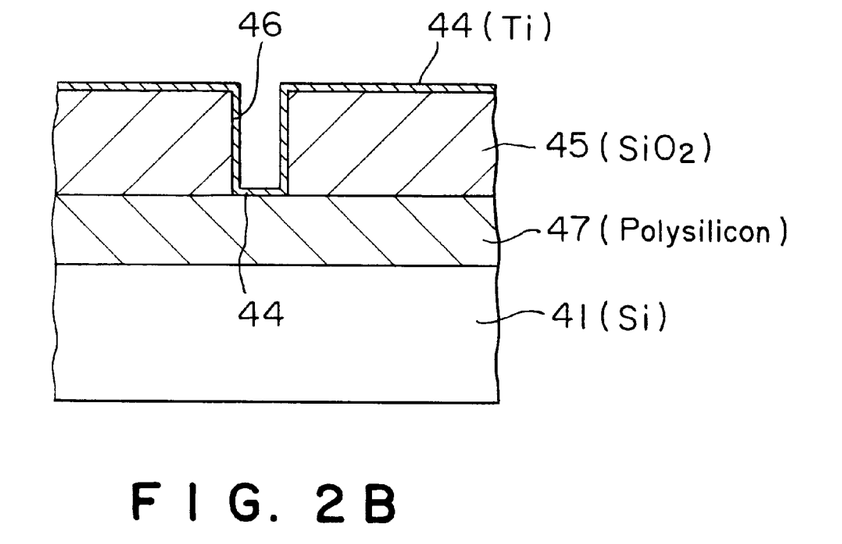

The Si wafer W on which a Ti film is to be formed is, for example, a Si substrate 41 provided with an insulating film 42 of $SiO_2$ and contact holes 43 (only one of them is shown) formed in the insulating film 42 as shown in FIG. 2A, or a Si substrate 41 provided with a polysilicon film 47 formed on the Si substrate 41, an insulating film 45 of $SiO_2$ formed on the polysilicon film 47, and via holes 46 (only one of them is shown) as shown in FIG. 2B. An insulating layer may be formed between the Si substrate 41 and the polysilicon film 47. The Si substrate 41 and the insulating film 45 of $SiO_2$ will generally be referred to as "silicon base".

In this embodiment, $SiH_4$ gas is used and process conditions are determined so that Si-to-$SiO_2$ selectivity is not less than one to deposit a Ti film 44 on the bottoms of the contact holes 43 or the bottoms of the via holes 46 in a high step coverage, maintaining an interfacial layer formed between the Si base 41 and the Ti film 44 in a satisfactory morphology (conditions of the surface and section of the interfacial layer). That is, process conditions are determined so that Ti is deposited on portions of the surface of the Si wafer 41 forming the bottom surfaces of the contact holes 43 or on portions of the polysilicon film 44 forming the bottom surfaces of the via holes 46, at a deposition rate higher than that at which Ti is deposited on the surface of the insulating film 42 of $SiO_2$ or the insulating film 45 of $SiO_2$. More concretely, the Si substrate 41 is heated at 550° C. or above to increase the Ti deposition rate on the Si substrate 41, and the flow rates of the processing gases, particularly, the flow rate of $SiH_4$ gas is controlled as described later so that Si-to-$SiO_2$ selectivity is one or above. Thus, the Ti film can be formed in high step coverage in the contact hole 43 or the via hole 46; that is, the thickness of the Ti film at the top of the contact hole 43 or the via hole 46 is not great. When Si-to-$SiO_2$ selectivity is three or above, the Ti film can be formed in a more satisfactory step coverage. The step coverage is expressed as A/B where A is the thickness of a Ti film formed on the Si substrate 41 in FIG. 2A and B is the thickness of a Ti film formed on the $SiO_2$ layer 42.

To form an interfacial layer of a satisfactory morphology and securing a high Si-to-$SiO_2$ selectivity, a preferable $SiH_4$ flow rate is in the range of 1 to 5 sccm, more preferably, in the range of 1 to 3 sccm. If $SiH_4$ flow rate is less than 1 sccm, the effect of $SiH_4$ on the improvement of the morphology of the interfacial layer is insignificant. If $SiH_4$ flow rate is greater than 5 sccm, it is difficult to adjust the Si-to-$SiO_2$ selectivity to a desired value.

Preferable flow rates of $TiCl_4$ gas, $H_2$ gas and Ar gas are in the range of 5 to 15 sccm, in the range of 0.5 to 3.5 slm and in the range of 0.5 to 2 slm, respectively. It is preferable that the output capacity of the radio frequency power source is in the range of 200 to 800 W, and the pressure in the vessel 1 is in the range of 0.5 to 3.0 torr.

Experiments were conducted to verify the effects of the present invention, in which Ti films were formed on a $SiO_2$ film provided with contact holes. In the experiments, the vessel 1 was evacuated to 1.0 torr, the output power of the radio frequency power source 23 (13.56 MHz) was 200 W, $H_2$ gas flow rate was 1 slm, Ar gas flow rate was 1 slm, $TiCl_4$ gas flow rate was 10 sccm, and $SiH_4$ gas flow rate was varied in the range of 1 to 5 sccm.

Figure 3:
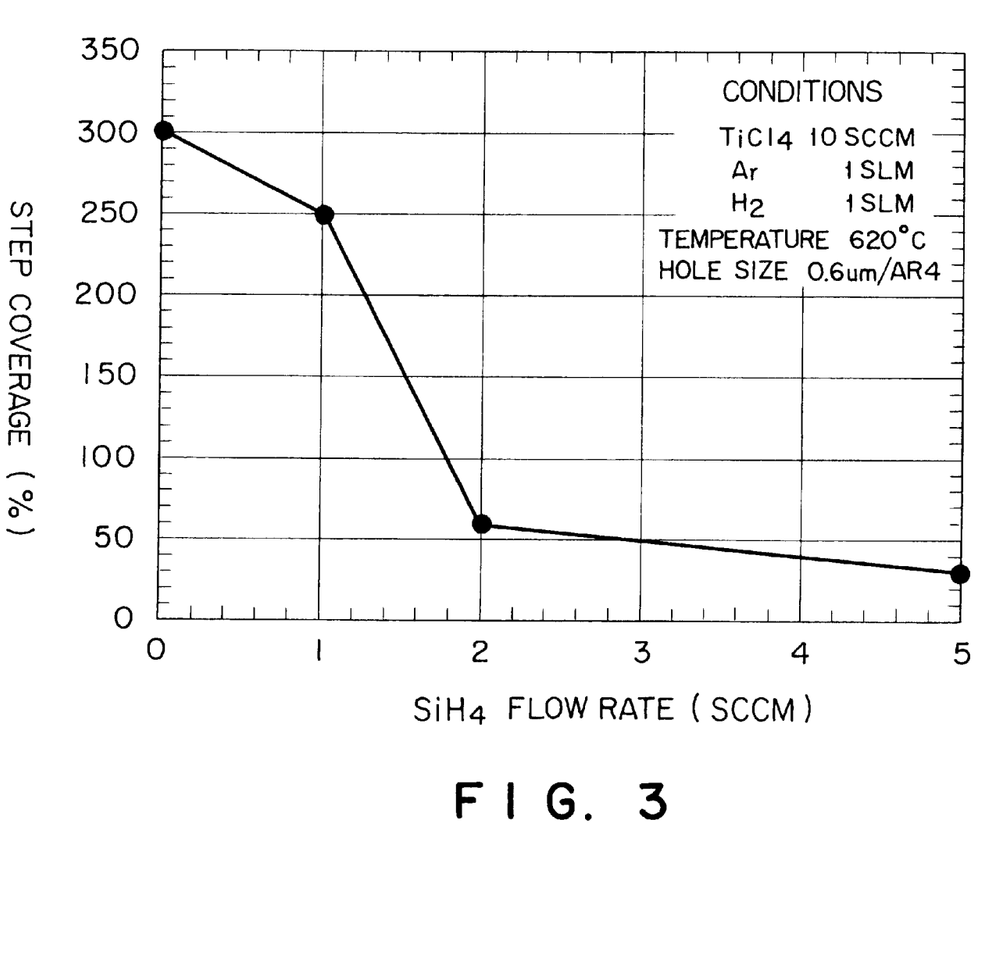
FIG. 3 is a graph showing the dependence of step coverage on the flow rate of $SiH_4$ gas.

FIG. 3 is a graph showing the relationship of the step coverage with the flow rate of $SiH_4$ gas when the Si wafer was heated at 620° C. The diameter of the hole is about 0.6 micronmeter, and the aspect ratio is about 4. As is obvious from FIG. 3, the step coverage decreases with the increase of the $SiH_4$ flow rate.

Figure 4:
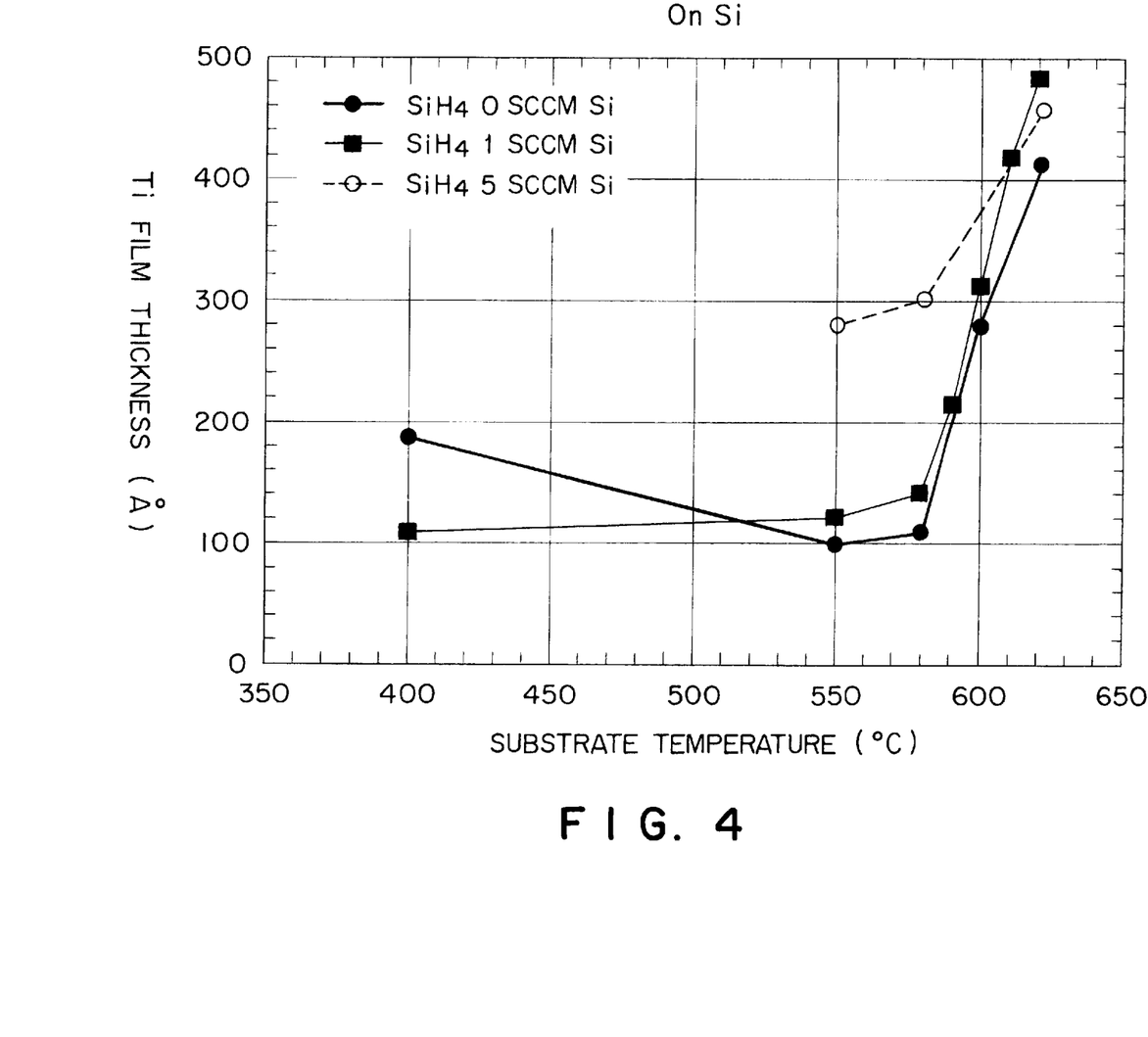
FIG. 4 is a graph showing the dependence of the thickness of a Ti film formed on Si on the temperature of the Si substrate for $SiH_4$ flow rates of 0 sccm, 1 sccm and 5 sccm.
Figure 5:
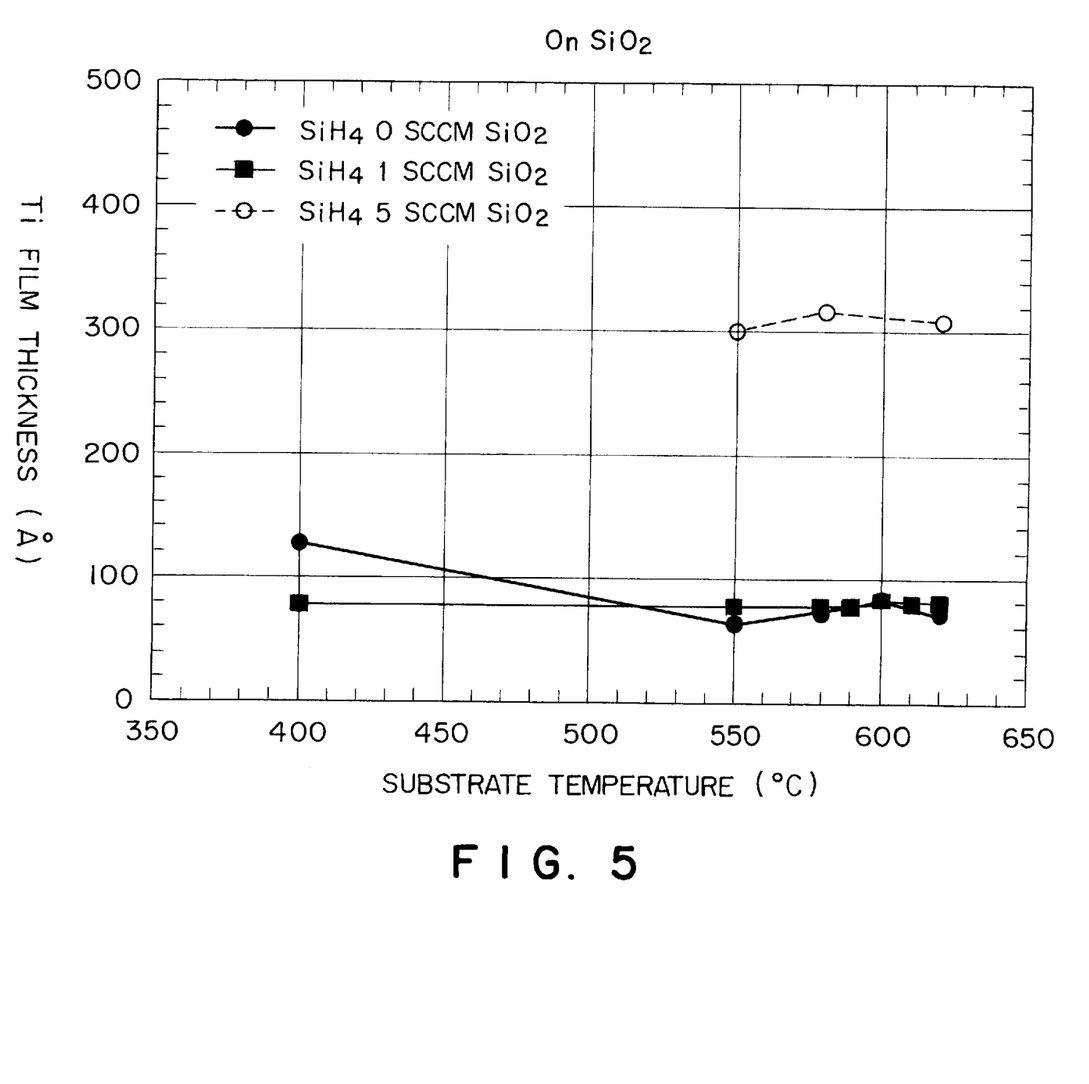
FIG. 5 is a graph showing the dependence of the thickness of a Ti film formed on $SiO_2$ on the temperature of the Si substrate for $SiH_4$ flow rates of 0 sccm, 1 sccm and 5 sccm.

FIG. 4 is a graph showing the relationship of the thickness of a Ti film formed on a Si substrate with the temperature of the Si substrate, for $SiH_4$ flow rates of 0 sccm, 1 sccm and 5 sccm determined on the basis of experiments, in which the temperature of the Si substrate was varied up to 620° C. It will be noted that the Ti film thickness begins to increase when the temperature exceeds 550° C. Particularly when the temperature exceeds 580° C., the film thickness increases sharply. FIG. 5 is a graph showing the relationship of the thickness of a Ti film formed on $SiO_2$ with the temperature of the Si substrate, for $SiH_4$ flow rates of 0 sccm, 1 sccm and 5 sccm determined on the basis of experiments, in which the temperature of the Si substrate was varied up to 620° C. It is observed that the Ti film thickness does not change substantially with the temperature change. As is obvious from FIGS. 4 and 5, the Si-to-$SiO_2$ selectivity increases with the increase of the temperature of the Si substrate beyond 550° C. and is very high when the temperature of the Si substrate is 580° C. or above. The Si-to-$SiO_2$ selectivity is greater than one even if $SiH_4$ flow rate is as much as 5 sccm when the temperature of the Si substrate is 620° C. It is known from FIGS. 4 and 5 that the Si-to-$SiO_2$ selectivity is equal to or greater than one at $SiH_4$ flow rate in the range of 1 to 5 sccm if the temperature of the Si substrate is 550° C. or above. This range of the flow rate (1–5 sccm) of $SiH_4$ corresponds to about 0.05% to about 0.25% of the flow rate of all the processing gases and about 10% to about 50% of the flow rate of the $TiCl_4$ gas. The step coverage improves if the Si-to-$SiO_2$ selectivity increases, and an allowable step coverage can be achieved when the Si-to-$SiO_2$ selectivity is one or above.

Figure 6:
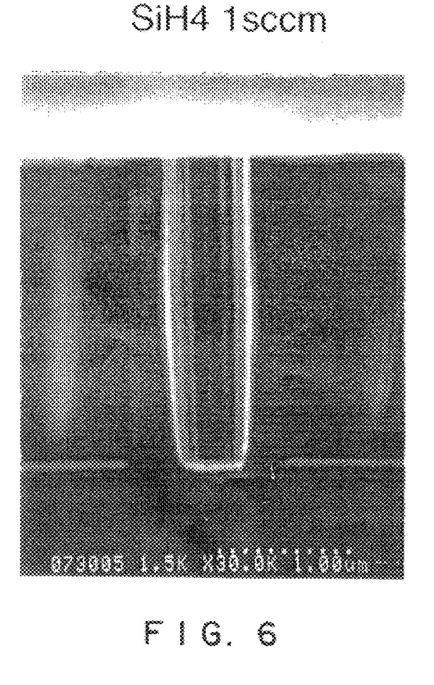
FIG. 6 is an electron micrograph of a Ti film formed in a contact hole with the substrate heated at 620° C. and $SiH_4$ supplied at 1 sccm.
Figure 7:
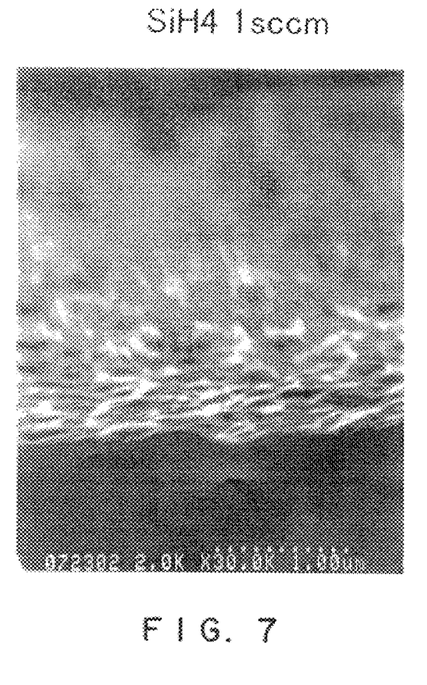
FIG. 7 is an electron micrograph of a $TiSi_x$ interfacial layer formed between a Si base and a Ti film formed on the Si base.

FIG. 6 is an electron micrograph of a Ti film formed in a contact hole with the substrate heated at 620° C. and $SiH_4$ supplied at 1 sccm. The Ti film is formed in the contact hole in a high step coverage. FIG. 7 is an electron micrograph of a $TiSi_x$ interfacial layer formed between a Si base and a Ti film formed on the Si base by the diffusion of Si into the Ti film. The electron microphotograph as taken after removing the $TiSi_x$ film with dilute hydrofluoric acid. FIG. 7 proves that $SiH_4$ is effective in improving the morphology of the interfacial layer.

The experiments proved that both the morphology of the interfacial layer between the Si base and the Ti film and step coverage are satisfactory when $SiH_4$ gas is used in addition to $TiCl_4$ gas, $H_2$ gas and Ar gas, the Si substrate is heated at 550° C. or above, and the flow rates of the processing gases, particularly, the flow rate of $SiH_4$ gas is controlled properly.

As described above, a process gas with a higher $SiH_4$ concentration provides $TiSi_x$ interfacial layer with a better morphology, whereas a process gas with a lower $SiH_4$ concentration provides a better step coverage. Therefore, in an early stage of a Ti deposition, the $SiH_4$ concentration may be from 20% to 50% of the $TiCl_4$ gas, or from 0.1% to 0.25% of the total gas. Following that stage, the $SiH_4$ concentration may be changed to less than 0.1% of the total gas, or less than 20% of the $TiCl_4$ gas. This process can provide the interfacial layer with a better morphology and a titanium film with a better step coverage.

The Si substrate provided with the Ti film thus formed is placed in a chamber, $TiCl_4$ gas, Ar gas, $NH_3$ gas and MMH (monomethyl hydrazine) gas is supplied into the chamber to construct a two-layer barrier layer by forming a TiN film over the Ti film, and then a wiring metal film, such as an aluminum film, is formed over the two-layer barrier layer.

The present invention is not limited in its practical application to the embodiments specifically described herein. For example, other gasses may be used in addition to $TiCl_4$ gas, $H_2$ gas and Ar gas and $SiH_4$ gas, and process conditions are not limited to those described above.

Although the invention has been described in its preferred embodiments with a certain degree of particularity, it is to be understood that the embodiments are illustrative and not restrictive and many changes and variations may be made therein without departing from the scope and spirit of the invention.

What is claimed is:

1. A method of forming a titanium film by chemical vapor deposition in holes formed in an insulating film provided on a silicon base, said method comprising the steps of:

loading a silicon base having thereon an insulating film formed with holes into a film forming chamber;

evacuating the chamber at a predetermined vacuum;

supplying processing gases including $TiCl_4$ gas, a reduction gas, Ar gas and $SiH_4$ gas into the film forming chamber; and producing a plasma in the film forming chamber to deposit a titanium film in the holes formed in the insulating film, while said silicon base is heated at a temperature of from 550 to 630° C., and while said $TiCl_4$ gas and said $SiH_4$ gas are supplied with a flow rate of the $SiH_4$ gas being from 10 to 50% of a flow rate of the $TiCl_4$ gas, to thereby obtain a silicon-to-insulating film selectivity of not less than one.

2. The method of forming a titanium film by chemical vapor deposition according to claim 1, wherein the$SiH_4$ gas has a flow rate which is from about 0.05 to about 0.25% of the flow rate of all of the processing gases.

3. The method of forming a titanium film by chemical vapor deposition according to claim 1, wherein the reduction gas is $H_2$.

4. The method of forming a titanium film by chemical vapor deposition according to claim 1, wherein said silicon base is heated at a temperature from 580 to 630° C.

5. The method of forming a titanium film by chemical vapor deposition according to claim 1, wherein said $TiCl_4$ gas, $H_2$ gas, Ar gas and $SiH_4$ gas have flow rates of 5 to 15 sccm, 0.5 to 3.5 slm, 0.5 to 2 slm and 1 to 5 sccm, respectively.

6. A method of forming a titanium film in holes formed in an insulating film provided on a silicon base, said method comprising the steps of:

loading a silicon base having thereon an insulating film formed with holes into a film forming chamber;

evacuating the chamber at a predetermined vacuum;

supplying processing gases including $TiCl_4$ gas, a reduction gas, Ar gas and $SiH_4$ gas into the film forming chamber;

producing a plasma in the film forming chamber to deposit a titanium film in the holes formed in the insulating film, while said silicon base is heated at a temperature of from 550 to 630° C., and while said $TiCl_4$ gas and said $SiH_4$ gas are supplied with a flow rate of the $SiH_4$ gas being from 10 to 50% of a flow rate of the $TiCl_4$ gas, to thereby obtain a silicon-to-insulating film selectivity of not less than one; and depositing a titanium nitride film on the titanium film.

7. The method of forming a titanium film by chemical vapor deposition according to claim 6, wherein the $SiH_4$ gas has a flow rate which is from about 0.05 to about 0.25% of the flow rate of all of the processing gases.

8. The method of forming a titanium film by chemical vapor deposition according to claim 6, wherein the reduction gas is $H_2$.

9. The method of forming a titanium film by chemical vapor deposition according to claim 6, wherein said silicon base is heated at a temperature from 580 to 630° C.

10. The method of forming a titanium film by chemical vapor deposition according to claim 6, wherein said $TiCl_4$ gas, $H_2$ gas, Ar gas and $SiH_4$ gas have flow rates of 5 to 15 sccm, 0.5 to 3.5 slm, 0.5 to 2 slm and 1 to 5 sccm, respectively.

11. A method of forming a titanium film by chemical vapor deposition in holes formed in an insulating film provided on a silicon base, said method comprising the steps of:

loading a silicon base having thereon an insulating film formed with holes into a film forming chamber;

evacuating the chamber at a predetermined vacuum;

supplying processing gases including $TiCl_4$ gas, a reduction gas, Ar gas and $SiH_4$ gas into the film forming chamber; and depositing a titanium film in the holes formed in the insulating film by producing a plasma in the film forming chamber, while said silicon base is heated at a temperature of from 550 to 630° C., and while said $TiCl_4$ gas and said $SiH_4$ gas are supplied with a flow rate of the $SiH_4$ gas being from 10 to 50% of a flow rate of the $TiCl_4$, to thereby obtain a silicon-to-insulating film selectivity of not less than one;

wherein said $SiH_4$ gas is supplied with a first concentration at an early stage of the step of depositing the titanium film, and with a second concentration smaller than the first concentration at a later stage of the step of depositing the titanium film.

12. The method of forming a titanium film by chemical vapor deposition according to claim 11, wherein said first concentration of the $SiH_4$ gas is from 0.10 to 0.25% of the total gases; and said second concentration of the $SiH_4$ gas is less than 0.10% of the total gases.

13. The method of forming a titanium film by chemical vapor deposition according to claim 11, wherein said first concentration of the $SiH_4$ gas is from 20 to 50% of the $TiCl_4$ gas; and said second concentration of the $SiH_4$ gas is less than 20% of the $TiCl_4$ gas.

14. A method of forming a titanium film by chemical vapor deposition in holes formed in an insulating film provided on a silicon base, said method comprising the steps of:

loading a silicon base having thereon an insulating film formed with holes into a film forming chamber;

evacuating the chamber at a predetermined vacuum;

supplying the processing gases including $TiCl_4$ gas, a reducing gas, Ar gas and $SiH_4$ gas into the film forming chamber; and producing a plasma in the film forming chamber to deposit a titanium film in the holes formed in the insulating film, while said silicon base is heated at a temperature of from 550 to 630° C., and while said $TiCl_4$ gas and said $SiH_4$ gas are supplied with a flow rate of the $SiH_4$ gas being from about 0.05 to about 0.25% of the flow rate of all of the processing gases, to thereby obtain a silicon-to-insulating film selectivity of not less than one.

15. The method of forming a titanium film by chemical vapor deposition according to claim 14, wherein the flow rate of the $SiH_4$ gas is from 10 to 50% of the flow rate of the $TiCl_4$ gas.

* * * * *